United States Patent
Liu et al.

(10) Patent No.: US 11,967,967 B2
(45) Date of Patent: Apr. 23, 2024

(54) SIGNAL SHAPING FOR COMPENSATION OF METASTABLE ERRORS

(71) Applicant: NXP B.V., Eindhoven (NL)

(72) Inventors: Qilong Liu, Eindhoven (NL); Shagun Bajoria, Eindhoven (NL); Lucien Johannes Breems, Waalre (NL)

(73) Assignee: NXP B.V., Eindhoven (NL)

( * ) Notice: Subject to any disclaimer, the term of this patent is extended or adjusted under 35 U.S.C. 154(b) by 154 days.

(21) Appl. No.: 17/807,454

(22) Filed: Jun. 17, 2022

(65) Prior Publication Data

US 2023/0412180 A1    Dec. 21, 2023

(51) Int. Cl.
*H03M 1/06* (2006.01)
*H03M 1/50* (2006.01)

(52) U.S. Cl.
CPC ....... *H03M 1/0604* (2013.01); *H03M 1/0626* (2013.01); *H03M 1/0687* (2013.01); *H03M 1/502* (2013.01)

(58) Field of Classification Search
CPC .......... H03M 1/662; H03M 1/66; H03M 1/68; H03M 1/0614; H03M 1/1245; H03M 1/70; H03M 1/745; H03M 3/37; H03M 3/372; H03M 3/424; H03M 3/454; H03M 3/458; H03M 3/464; H03M 1/002; H03M 1/06; H03M 1/0612; H03M 1/0624; H03M 1/0626; H03M 1/0629; H03M 1/0658; H03M 1/066; H03M 1/1009; H03M 1/1014; H03M 1/1057; H03M 1/1061; H03M 1/1071; H03M 1/12; H03M 1/1205; H03M 1/122; H03M 1/365; H03M 1/661; H03M 1/74; H03M 1/742; H03M 1/765; H03M 1/822; H03M 3/384; H03M 3/396;
(Continued)

(56) References Cited

U.S. PATENT DOCUMENTS 5,594,443 A * 1/1997 Lam ................. H03M 1/661
341/144
6,353,404 B1 * 3/2002 Kuroiwa ................. H03M 1/70
341/139
(Continued)

OTHER PUBLICATIONS

Zhang, C., "Broadband Continuous-time MASH Sigma-Delta ADCs", ISBN: 978-90-38-65322-8 Retrieved from the Internet: URL:https://pure.tue.nl/ws/portalfiles/por tal/182349223/20210921_Zhang_Chenming_hf.pdf, Sep. 21, 2021.

*Primary Examiner* — Linh V Nguyen
(74) *Attorney, Agent, or Firm* — David G. Dolezal

(57) ABSTRACT

A circuit that receives a series a digital signal values from a digital circuit output where the output has a propensity to produce digital values with a metastable error. The circuit produces an analog output signal having values over time corresponding to the digital signal values. The circuit includes two data paths that receive the digital signal values and produce a delayed analog signal. One data path includes an analog delay and the other data path includes a digital delay and a digital to analog converter. The circuit uses the output of the two data paths to adjust a later output analog signal value that is produced by the analog circuit output subsequent to a former output analog signal value produced by the analog circuit output that corresponds to a digital signal value of the series with a metastable error to compensate for the metastable error in the output signal.

20 Claims, 14 Drawing Sheets

(58) Field of Classification Search
CPC ........ H03M 3/40; H03M 3/408; H03M 3/434; H03M 3/502
USPC .................................. 341/118–121, 143, 144
See application file for complete search history.

(56) References Cited

U.S. PATENT DOCUMENTS

| | | | | |
|---|---|---|---|---|
| 8,493,258 | B1* | 7/2013 | Wyville | H03M 1/0614 |
| | | | | 341/143 |
| 8,502,720 | B1* | 8/2013 | Wyville | H03M 1/0629 |
| | | | | 341/149 |
| 10,014,878 | B1* | 7/2018 | Breems | H03M 3/464 |
| 10,763,888 | B1* | 9/2020 | Zhang | H03M 3/352 |
| 2007/0139240 | A1* | 6/2007 | Mitteregger | H03M 3/37 |
| | | | | 341/143 |
| 2008/0024336 | A1* | 1/2008 | Park | H04B 17/382 |
| | | | | 341/110 |
| 2010/0259431 | A1* | 10/2010 | Yu | H03M 3/408 |
| | | | | 341/143 |
| 2016/0134302 | A1* | 5/2016 | Schafferer | H03M 3/458 |
| | | | | 341/120 |
| 2018/0241409 | A1* | 8/2018 | Dagher | H03M 3/396 |
| 2020/0389179 | A1* | 12/2020 | Tseng | H03M 1/74 |

* cited by examiner

| WITH METASTABLE ERROR | T1 | T2 | T3 | T4 | T5 | T6 | T7 | T8 |
|---|---|---|---|---|---|---|---|---|
| DI (D) | 0V | 0V | .3V | *.5V | .9V | 1.2V | 1.5V | 1.8V |
| DAC 411 (A) | 0V | 0V | .3V | *.5V | .9V | 1.2V | 1.5V | 1.8V |
| DELAY 405 (A) | X | 0V | 0V | .3V | *.5V | .9V | 1.2V | 1.5V |
| DELAY 417 (DOUT) (D) | X | 0V | 0V | .3V | *.6V | .9V | 1.2V | 1.5V |
| DAC 413 (A) | X | 0V | 0V | .3V | *.6V | .9V | 1.2V | 1.5V |
| S (DAC 413-DELAY 405) (A) | X | 0V | 0V | 0V | *.1V | 0V | 0V | 0V |
| T (DAC 411+S) (A) | 0V | 0V | .3V | *.5V | *1.0V | 1.2V | 1.5V | 1.8V |

501 →

| WITH NO ERROR | T1 | T2 | T3 | T4 | T5 | T6 | T7 | T8 |
|---|---|---|---|---|---|---|---|---|
| DI (D) | 0V | 0V | .3V | .6V | .9V | 1.2V | 1.5V | 1.8V |
| DAC 411 (A) | 0V | 0V | .3V | .6V | .9V | 1.2V | 1.5V | 1.8V |
| DELAY 405 (A) | X | 0V | 0V | .3V | .6V | .9V | 1.2V | 1.5V |
| DELAY 417 (DOUT) (D) | X | 0V | 0V | .3V | .6V | .9V | 1.2V | 1.5V |
| DAC 413 (A) | X | 0V | 0V | .3V | .6V | .9V | 1.2V | 1.5V |
| S (DAC 413-DELAY 405) (A) | X | 0V | 0V | 0V | 0V | 0V | 0V | 0V |
| T (DAC 411+S) (A) | 0V | 0V | .3V | .6V | .9V | 1.2V | 1.5V | 1.8V |

SIGNAL SHAPING FOR COMPENSATION OF METASTABLE ERRORS

BACKGROUND OF THE INVENTION

Field of the Invention

This invention relates to signal shaping for compensation of metastable errors.

Background

Digital data signals typically reside at a known data state voltage (e.g., 0V for a logical "0", VDD for a logical "1"). However, in some systems, digital data signals may be at a voltage other than a known data state voltage, thereby causing a metastable error in the data.

BRIEF DESCRIPTION OF THE DRAWINGS

The present invention may be better understood, and its numerous objects, features, and advantages made apparent to those skilled in the art by referencing the accompanying drawings.

FIG. 5 is a chart showing the voltages of the circuit of FIG. 4 during an operation according to one embodiment of the present invention.

2

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Disclosed herein is a circuit that receives a series a digital signal values from a digital circuit output where the digital circuit output has a propensity to produce digital values with a metastable error. The circuit produces an analog output signal having values over time corresponding to the digital signal values of the series. The circuit includes two data paths that receive the digital signal values and produce a delayed analog signal. One data path includes an analog delay and the other data path includes a digital delay and a digital to analog converter. The circuit uses the output of the two data paths to adjust a later output analog signal value that is produced by the analog circuit output subsequent to a former output analog signal value produced by the analog circuit output that corresponds to a digital signal value of the series with a metastable error to compensate for the metastable error in the output signal.

In one embodiment, using analog signals produced from a path with an analog delay and a path with a digital delay to adjust an analog output value of a circuit output that is subsequent to a previous output value of the circuit output that corresponds to the input value with a metastable error may, in some embodiments, be useful in reducing glitches in the analog output signal in such applications as an audio codec, without having to delay resultant signals for correction due to the metastable error.

Figure 1:
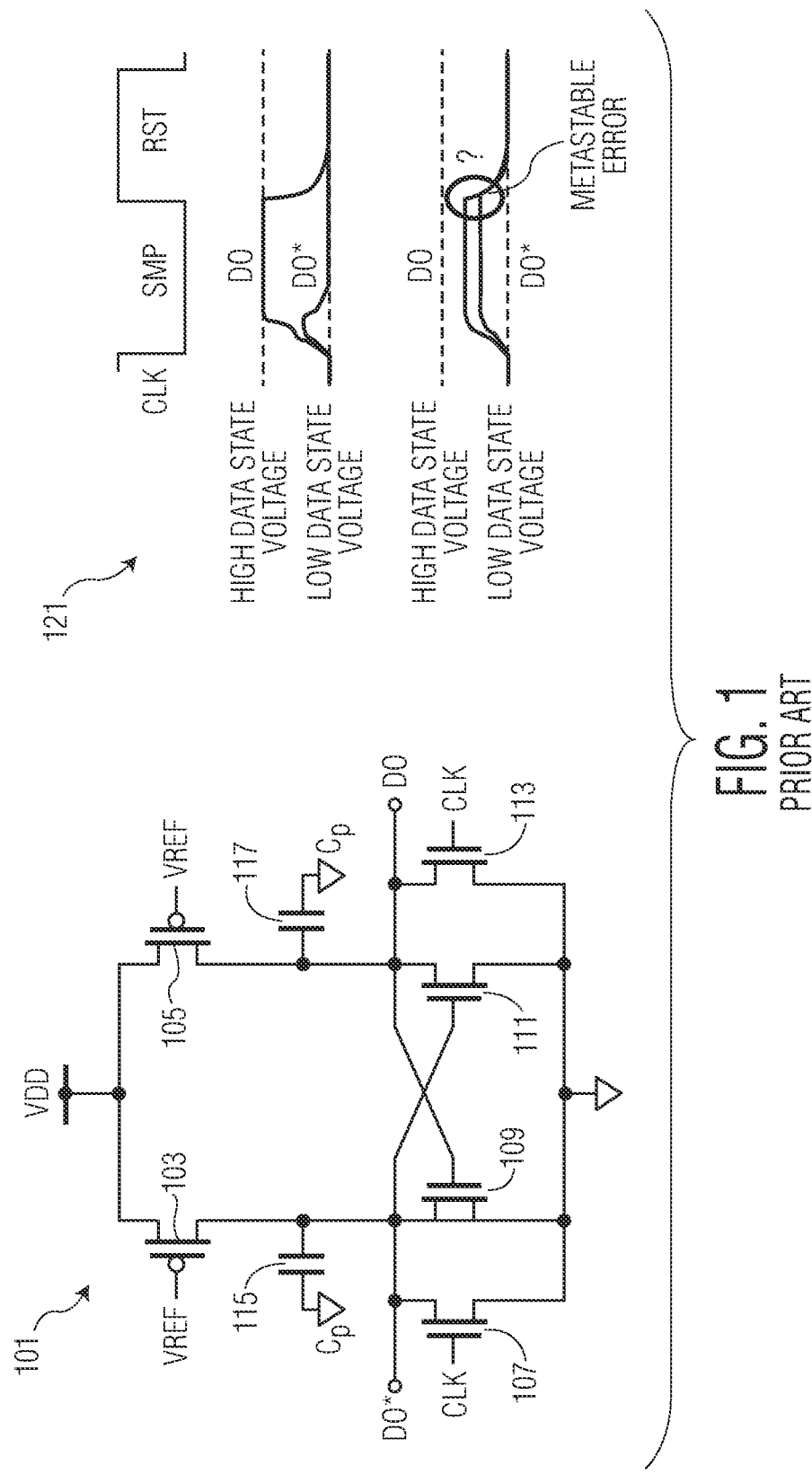
FIG. 1 is a circuit diagram of a prior art regenerative latch and a timing diagram showing its operation.

FIG. 1 shows an example of a prior art regenerative latch 101 used for analog to digital conversion. Latch 101 includes an input (the gate of PFET 103) to receive an analog signal (VIN) and an input (the gate of PFET 105) to receive a reference signal VREF. Latch 101 produces a differential output signal DO and DO* that provides a latched signal at data state voltages (e.g., ground, VDD) indicative of the comparison between VIN and VREF. Latch 101 includes NFETs 107 and 113 whose gates receive a clock signal CLK and NFETs 109 and 111 whose gates are connected to DO and DO* respectively for latching the value.

As shown by timing diagram 121, clock signal (CLK) is used to divide the operation of latch 101 into a sampling phase (SMP) and a reset phase (RST). During the sampling phase when the clock signal is low, latch 101 starts regeneration with the initial voltage of VIN and VREF. A positive feedback of the latch amplifies the voltage difference between VIN and VREF and drives the output nodes DO and DO* to opposite directions to a high data state voltage and a low data state voltage. See the top timing diagram of diagrams 121 showing the voltage levels of DO and DO* being driven to the high data state voltage and the low data state voltage to represent a logic 1. A second latch (not shown) will latch the logic values represented by DO and DO* before the end of the sample phase.

During the reset phase (CLK is high), DO and DO* will be pulled down towards ground by conductive NFETs 107 and 113, and NFETs 109 and 111 will become non-conductive. Due to the non-zero switch resistance, the voltage difference between VIN and VREF will be translated to nodes DO* and DO and stored on capacitors 115 and 117 respectively, which forms the initial voltage for regeneration in the next cycle.

Due to the finite transconductance (gm) of NFETs 109 and 111, the regeneration gain (G) of the latch is limited. When the differential voltage (VIN-VREF) is sufficiently large, at the end of the sampling phase, DO and DO* can be driven to the high data state voltage and low data state voltage to be clearly resolved as a logic "1" or a logic "0". See the top timing diagram of timing diagrams 121. However, when the difference between VIN-VREF is small, latch 101 cannot provide enough gain to bring DO/DO* to the high data state voltage/low data state voltage to clearly indicate a logic "1" or "0" at the end of the sample phase, thus generating a metastable error. See the bottom timing diagram of timing diagrams 121. When sampled by a following latch (not shown), the metastable error of the undefined logic values will propagate through the logic chain and may lead to a wrong output or even instability in worst cases.

Figure 2:
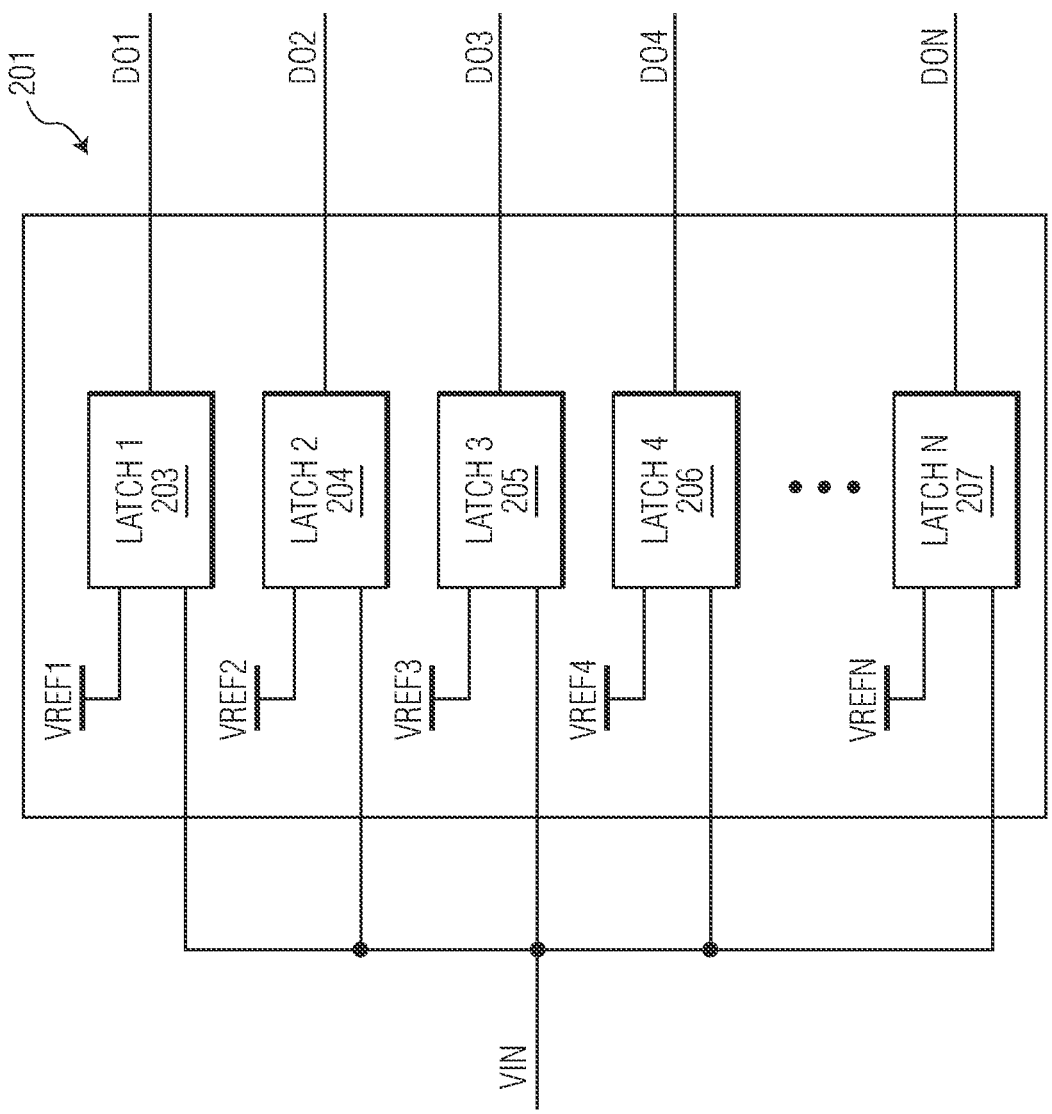
FIG. 2 is a circuit diagram of a prior art analog to digital converter.

FIG. 2 is a circuit diagram of an analog to digital converter (ADC) circuit 201. ADC circuit 201 includes a number of latch circuits (1-N) (203-207). Each latch circuit (1-N) includes a latch (e.g., a regenerative latch similar to latch 101) that has a propensity to generate a metastable error. In one embodiment, a latch having a propensity to generate a metastable error is a latch that, due to timing, clock speed, device size, input voltage, and/or configuration (or due to other factors) may produce an output with a metastable error during operation. In one example, a regenerative latch that receives a clock signal with a relatively high frequency and a low input voltage may have a propensity to produce a metastable error at its output. The latch of each latch circuit compares VIN to a reference value (e.g., VREF1-VREFN). In one embodiment. If VIN is greater than the reference value, then the latch circuit will generate a logical 1. If VIN is less than the reference voltage, then the latch circuit will generate a logical 0. Based on these comparisons, DO1-DON will generate a digital value indicative of VIN.

Figure 3:
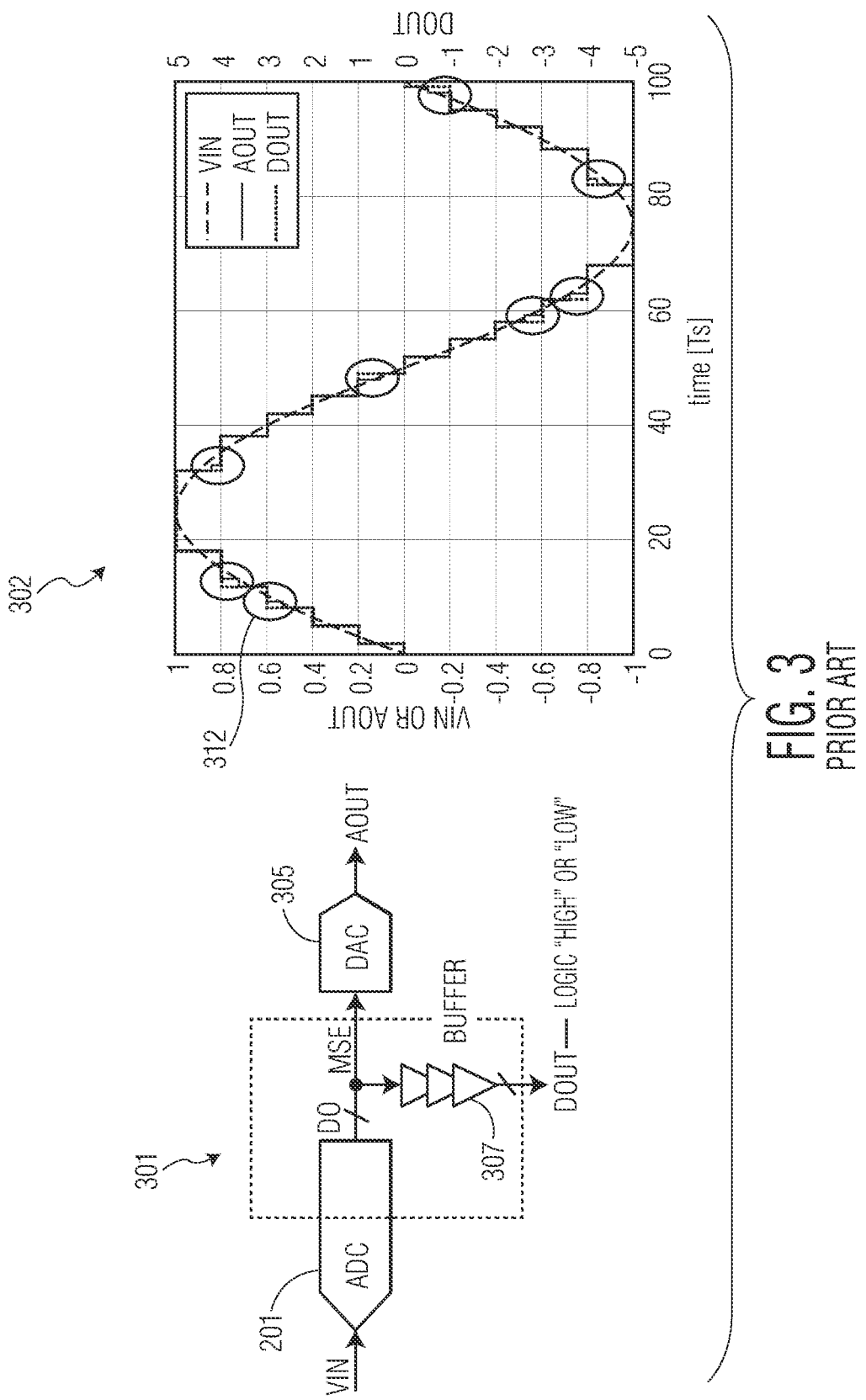
FIG. 3 is a circuit diagram of a model of a prior art analog to digital convertor to digital to analog converter and a graph showing its voltages during an operation when receiving a sinusoidal analog input.

FIG. 3 shows portions of an ADC circuit 301 including analog to digital converter (ADC) circuit 201, which has a propensity to produce metastable errors (MSE) as described with respect to FIG. 1. ADC circuit 301 includes buffer 307, which is a series of latches. As the value with a metastable error is passed along the latches, the latches of buffer 307 will produce an output signal with voltages at the data state voltages such that DOUT will be well defined at a logic 1 or logic 0 and the metastable error will be resolved to a known logic state. Digital to Analog (DAC) 305 produced an analog signal based on DO.

Graph 302 shows the effect of metastable errors for an input analog sinusoidal signal of VIN. As shown in FIG. 2, ADC circuit 201 includes a number of latches (latch 1-N) configured in parallel with each comparing VIN to a different reference voltage of a number of reference voltages (e.g., 0.9, 0.7, 0.5, 0.3, 0.1, −0.1, −0.3, −0.5, −0.7, and −0.9 Volts). As the voltage of VIN approaches a reference voltage received by a specific latch of ADC circuit 201 (e.g. 0.5V), the specific latch that compares VIN to 0.5V may produce a metastable error. See circle 212 in graph 202. Accordingly, there is a possibility of a metastable error being produced as VIN approaches a reference voltage.

When digital to analog converter (DAC) 305 processes the output signal (DO) of ADC circuit 201, its output (AOUT) may also provide a voltage reflective of the metastable error. In such instances, AOUT may deviate from DOUT due to a metastable error.

In some ADC circuits, AOUT may be used to adjust the output of an analog to digital conversion e.g., by using AOUT to adjust VIN, or by providing AOUT to a subsequent ADC stage as in a pipelined ADC circuit. Accordingly, the mismatch between AOUT and DOUT may lead to errors such as white noise spectrum glitches in the output of an analog to digital circuit.

In some examples, correcting the mismatch between AOUT and DOUT may take one or more clock cycles as were DAC 305 is coupled to the output of buffer 307. Such delay may be unacceptable especially in a pipelined ADC circuit where AOUT is provided to a subsequent ADC stage.

Figure 4:
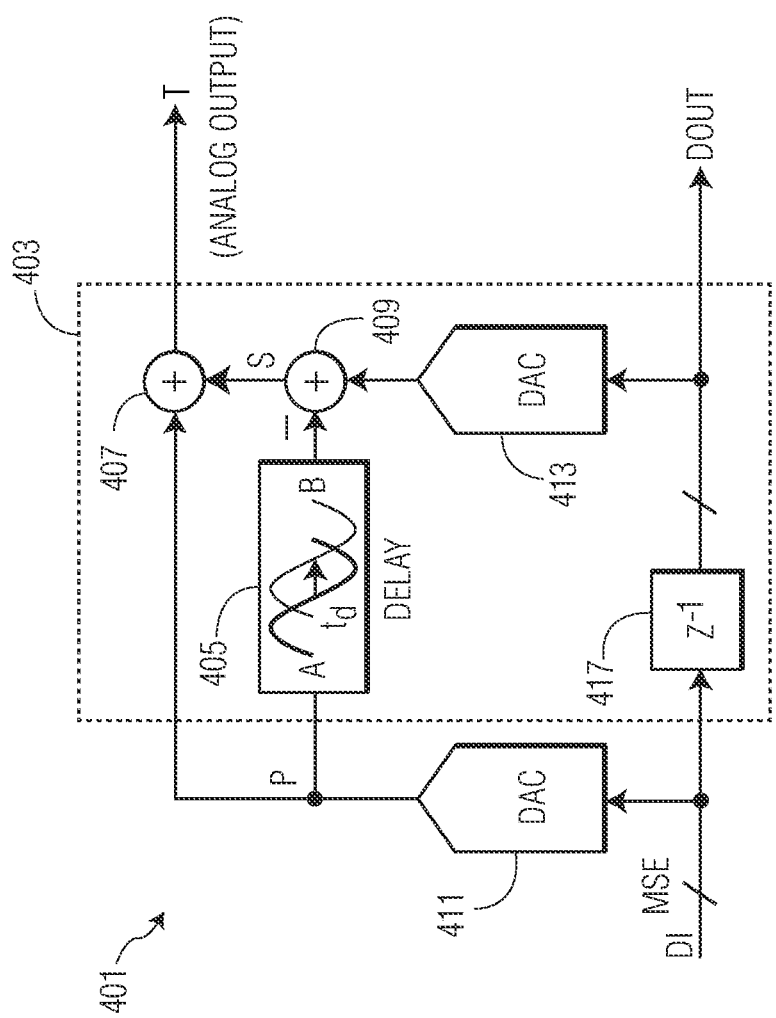
FIG. 4 is a circuit diagram of a circuit including a metastability shaper according to an embodiment of the present invention.

FIG. 4 is a circuit diagram of a portion of an ADC circuit that includes a shaping circuit for providing an adjusted analog signal T to compensate for a metastable error in a digital input signal. Circuit 401 includes a shaper circuit 403 with a digital input (DI), a digital output (DOUT), an analog input (P), and an analog output (T). In one embodiment, circuit 401 receives a digital input (DI) e.g., from an analog to digital converter, a memory circuit, or other type of digital circuit (not shown in FIG. 4) that has a propensity to produce values with a metastable error (MSE). In one embodiment, DI is received from an ADC that is similar to ADC circuit 201 where signal DI is signal DO(1-N) of FIG. 2. In the embodiment shown, DI is a single ended, parallel digital signal that provides a series of digital values. However, in other embodiments, DI may be a differential digital signal.

Circuit 401 includes a DAC 411 that is used to provide an analog signal of DI that is used for further processing. Circuit 401 also includes a digital delay circuit 417 that produces a digital output (DOUT) that does not have a propensity to produce a metastable error in that digital output (DOUT) that will be at one of a high data state voltage or a low data state voltage. In some embodiments, delay circuit 417 is implemented with a flip flop, a series of inverters, or a series of buffers (e.g., similar to buffers 307) to provide a quantized digital signal that is delayed by a clock cycle. In other embodiments, delay provided by delay circuit 417 may be for other amounts of time such as for a half clock cycle, one and a half clock cycles, or two clock cycles.

As with DAC 305 of FIG. 3, because DAC 411 receives a digital signal with possible metastable errors, analog output P may include the metastable value. Thus, analog output P may not match a subsequent DOUT signal that corresponds to the same value of DI in that delay circuit 417 has resolved any metastable errors to stable data state voltages.

Circuit 401 includes two data paths for providing delayed analog signals. A first data path includes DAC 411 and an analog delay circuit 405 that produces a delayed version of the output of DAC 411. See FIG. 14 and the discussion thereof regarding the different types of analog delay circuits that may be utilized. Circuit 401 includes a second data path which includes digital delay circuit 417 and a DAC 413.

Circuit 401 includes a combiner circuit 409 that subtracts the voltage of the output of the analog delay circuit 405 from the voltage of DAC 413 to produce a resultant signal (S). Combiner circuit 407 adds the output of combiner circuit 409 with the output of DAC 411 to provide an analog signal representative of DI that has been adjusted for metastable error compensation. In some embodiments, combiner circuits 407 and 409 may be implemented with one, three input combiner circuit (e.g., see FIG. 9). In the embodiment of FIG. 4, the analog signals are shown as signal ended signals. However, in other embodiments, they may be differential analog signals.

FIG. 5 sets forth tables 501 and 503 showing examples of operating voltages of the outputs for the identified devices of circuit 401 whose names are listed in the first column of the tables. An "(A)" after the device name indicates that the device output is analog signal where the signal voltage is the voltage listed in the table. A "(D)" after the device name indicates that the device output is a digital indication of the voltage listed in the table.

Table 501 shows how circuit 401 adjusts analog signal T when DI has a value with a metastable error (produced at time T4 in table 501). Table 503 shows the operation of circuit 401 with no metastable error.

Referring to table 501, row DI shows the voltages indicated by the digital (D) values produce at input DI over time periods T1-T8. In the table shown, DI is able to represent 8 voltage values from 0 to 2.1 volts at increments of 0.3 volts. During time periods T1-T3, the values of DI represent 0V, 0V, and 0.3V. During time period T4, a metastable error occurs where one of the bits of D1 is neither at the low data state value (0V) or the high data state value (1.8V). In this table, the value for DI at T4 is represented as 0.5V. At time periods T5-T8, the voltages represented by DI is 0.9V, 1.2 V, 1.5V, and 1.8V, respectively. This pattern is indicative of a rising voltage signal. In tables 501 and 503, the values of DELAY 405 (the output of delay circuit 405), DELAY 417 (the output of delay circuit 417) (DOUT), DAC 413, and S are shown as X because they are unknown as being based on a previous unknown value of DI.

Referring to table 501 for time period T2, DI indicates 0V and DAC 411 is at 0 volts. DELAY 405 is at 0V because DAC 411 was at 0V in time T1. DELAY 417 (DOUT) represents 0V and DAC 413 is at 0V because DI represented 0V in T1. Signal S is at 0V (DAC 413 minus the output of DELAY 405). Signal T is 0V because the output of DAC 411 and signal S are at 0V.

For time period T3, with DI indicates 0.3V and DAC 411 is at 0.3V. DELAY 405 is at 0V because signal DAC 411 was at 0V in time T2. DELAY 417 (DOUT) represents 0V and DAC 413 is at 0V because DI indicated 0V in T2. Signal S is at 0V (DAC 413 minus the output of DELAY 405). Signal T is 0.3V because the output of DAC 411 is 0.3V and signal S is at 0V.

At time T4, a value appears on DI that has a metastable error (as indicated by the "*"). The voltage value shown as indicated by DI at time T4 is 0.5V which is between increments 0.3V and 0.6V. DI is indicated at 0.5V because its digital output will generate 0.5V at the output of DAC 411. DELAY 405 is at 0.3V because DAC 411 was at 0.3V at time T3. DELAY 417 (DOUT) indicates 0.3V and DAC 413 is at 0.3V because DI indicated 0.3V at time T3. Signal S is at 0V (the output of DAC 413 minus the output of DELAY 405). Signal T is 0.5V because the output of DAC 411 is at 0.5V and signal S is at 0V.

Because of delay circuits 405 and 417, the effect of the metastable error in time T4 propagates in time T5 to some of the signals indicated by an "*" in table 501. At time T5, the voltage value indicated by DI is 0.9V. With DI indicating 0.9V, DAC 411 will also be at 0.9V volts. DELAY 405 is at 0.5V because DAC411 was at the metastable error value of 0.5V in time T4. DELAY 417 (DOUT) indicates 0.6V and DAC 413 is at 0.6V because delay circuit 417 has a quantizing aspect that will select a data voltage value of either 0.3V or 0.6 V even though DI indicates a metastable error at T4. Thus, at T5, the value indicated by DOUT (0.6V) and the voltage of DAC 413 (0.6V), which corresponds to the value of DI at T4, is a different voltage than the voltage of signal T at T4 (0.5V) which also corresponds to the value of DI at T4. For ADC circuits that rely on signal T to be at a voltage in one time period that is represented by DOUT in the next time period, this discrepancy may lead to output glitches or errors in the circuit output.

Accordingly, circuit 401 uses the outputs of delay circuit 405 and DAC 413 to produce a signal S that is used to adjust signal T in a subsequent time period to compensate for the variation (0.1V) from the voltage indicated by DOUT. At T5, signal S is at 0.1V (the output of DAC 413 minus the output of delay circuit 405). The 0.1V of signal S is added to Signal T in T5 to where signal T is at 1.0 V instead of the 0.9V, which is the output of DAC 411.

Accordingly, signal T is adjusted to a higher voltage 1.0V in time period T5 to compensate for signal T being at a lower voltage 0.5V in T4 than the voltage indicated by DELAY 417 (DOUT) at time T5 (0.6V) which corresponds to the DI value at T4 with the metastable error).

If at time period T5, the metastable error was resolved by delay circuit 417 (DOUT) to the lower voltage level of 0.3V, then the S signal at T5 would be –0.2V. (This case is not shown in FIG. 5). Accordingly for this case, signal T at time period T5 would be 0.7V (as opposed to 1.0V in table 501). This reduced voltage would compensate for signal T being at a higher voltage (0.5V) at T4 than DELAY 417 (DOUT) at T5 (0.3V) due to the metastable error at time period T4.

Table 503 shows a case where there are no metastable errors in DI. Because there are no metastable errors, the output of delay circuit 405 always equals the output of DAC 413. Thus, signal S is always zero volts where there is no adjustment is made to signal T.

Figure 6:
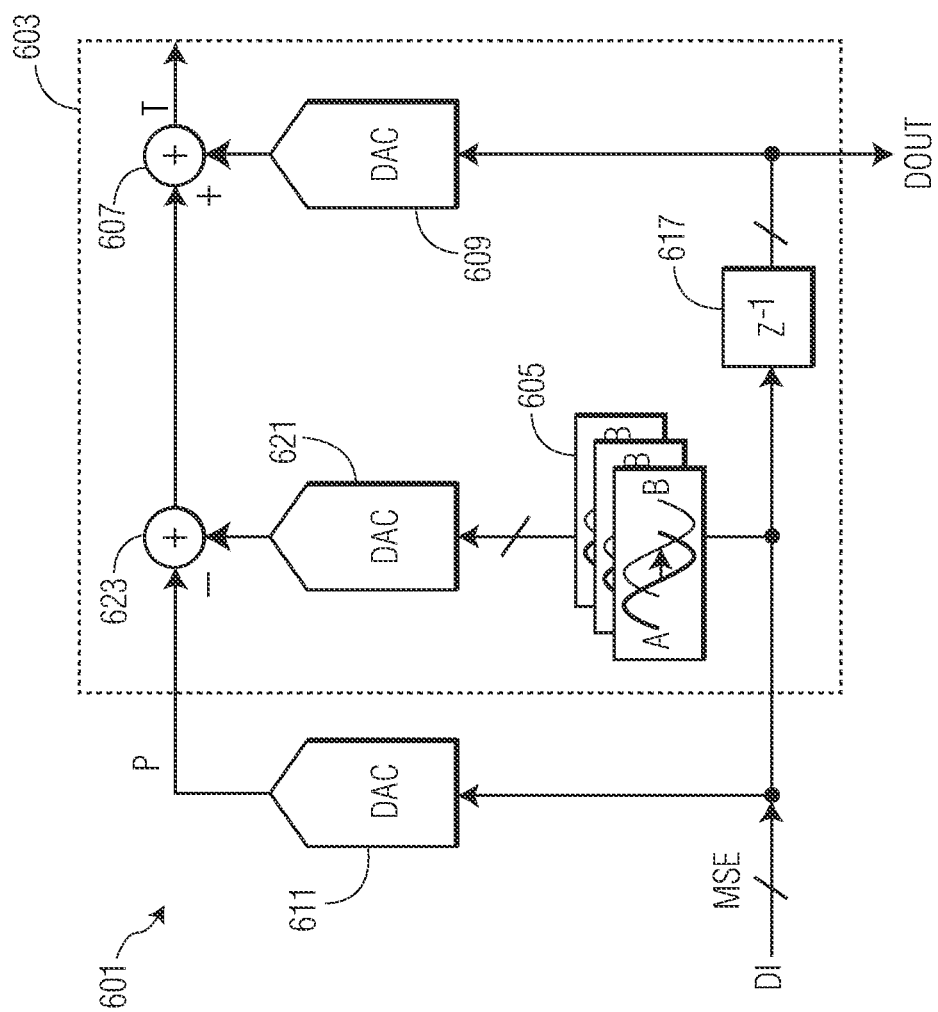
FIG. 6 is a circuit diagram of a circuit including a metastability shaper according to another embodiment of the present invention.

FIG. 6 is a circuit diagram of another embodiment of a portion of an ADC circuit that includes a shaping circuit for providing an adjusted analog signal T to compensate for a metastable error in a digital input signal. Circuit 601 includes a DAC 611 similar to DAC 411 of FIG. 4 and a shaper circuit 603. Circuit 601 includes a first data path for providing an analog delay signal including an analog delay circuit 605 and DAC 621. In the embodiment shown, analog delay circuit 605 is a multibit analog delay circuit that includes an analog delay circuit element for each digital bit of the DI signal to individually delay the bit signal. DAC 621 then converts the individually delayed bit signals to an analog value.

Circuit 601 includes a second data path for providing an analog delay signal that includes digital delay 617 and DAC 609 which are similar to digital delay circuit 417 and DAC 613 of FIG. 4. Shaper circuit 603 includes a combiner circuit 623 that subtracts the output of DAC 621 from the output (P) of DAC 611. Combiner circuit 607 adds the output of DAC 609 to the output of combiner circuit 623 to produce an analog signal T that is indicative of DI but is adjusted to compensate for metastable errors. In other embodiments, combiner circuits 623 and 607 could be implemented with one, three input combiner circuit.

In some embodiments, the configuration of FIG. 6 which utilizes a multibit analog delay circuit (605) to delay the digital signal before being provided to a DAC (621) to produce a delayed analog signal may be preferable to the configuration of FIG. 4 that utilizes uses an analog delay circuit (405) to delay the output of a DAC (411). Some DACs may have input tolerances such that the output of the DAC is not significantly affected by small voltage errors in its digital input signals. Accordingly, a 5% error in the output of the analog delay elements of circuit 605 will not significantly affect the output of DAC 621. However, a 5% error in analog delay circuit 405 would directly affect the compensation signal (S) (see FIG. 4). Thus, the configuration of FIG. 6 could be implemented with less precise analog delay circuitry than the configuration of FIG. 4. However, The configuration of FIG. 4 would utilize one less DAC.

Figure 7:
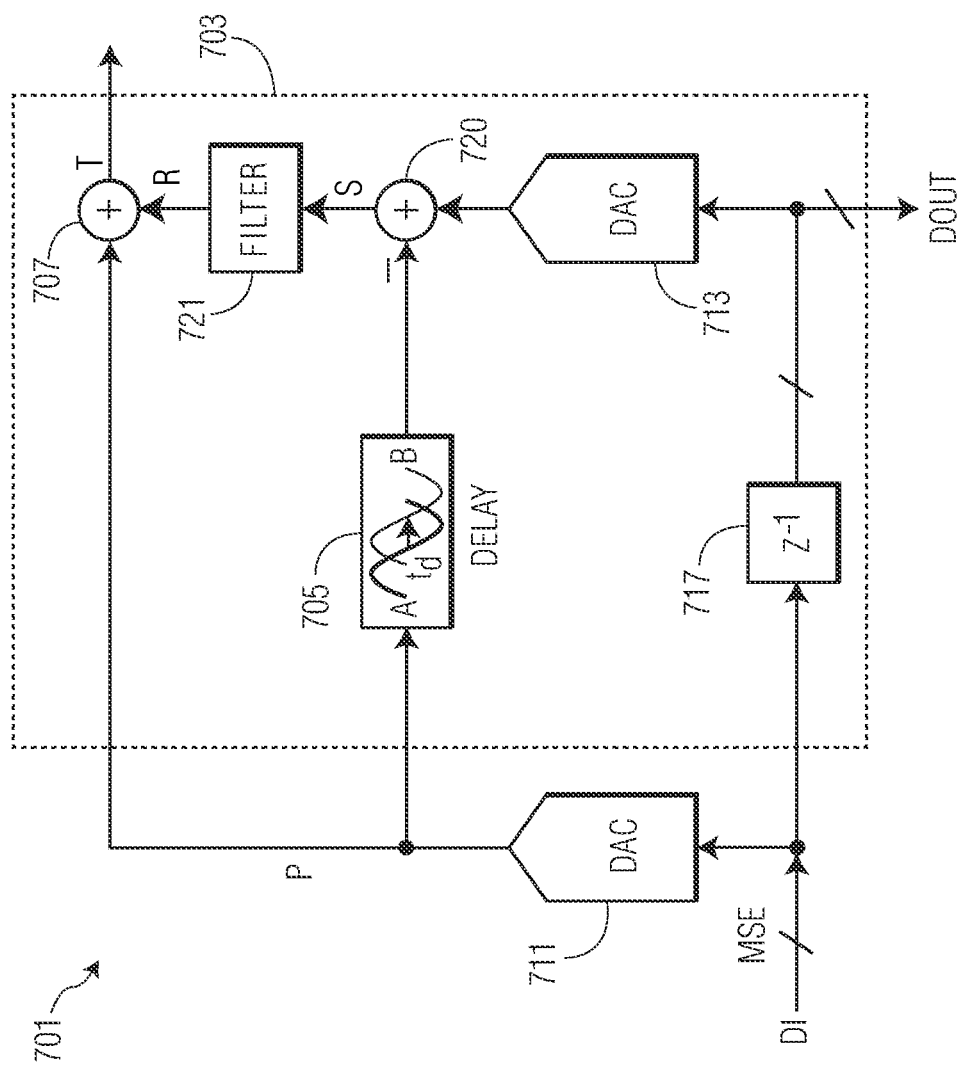
FIG. 7 is a circuit diagram of a circuit including a metastability shaper according to another embodiment of the present invention.

FIG. 7 is a circuit diagram of another embodiment of a portion of an ADC circuit that includes a shaping circuit for providing an adjusted analog signal T to compensate for a metastable error in a digital input signal. Circuit 701 includes a DAC 711, which is similar to DAC 411 of FIG. 4, and a shaper circuit 703. Circuit 701 includes a first data path from digital input DI for producing a delayed analog signal that includes DAC 711 and an analog delay circuit 705. Circuit 701 includes a second data path from digital input DI for producing delayed analog signal that includes digital delay circuit 717 and DAC 713. Combiner circuit 720 subtracts the output of delay circuit 705 from the output of DAC 713.

Circuit 703 includes a filter 721 for filtering the output of combiner circuit 720 (signal S) so as to provide a smoother signal R. Combiner circuit 707 adds the output of filter 721 (signal R) with the output of DAC 711 to produce an analog signal indicative of the voltage values of D1 and is adjusted to compensate for metastable errors.

Figure 8:
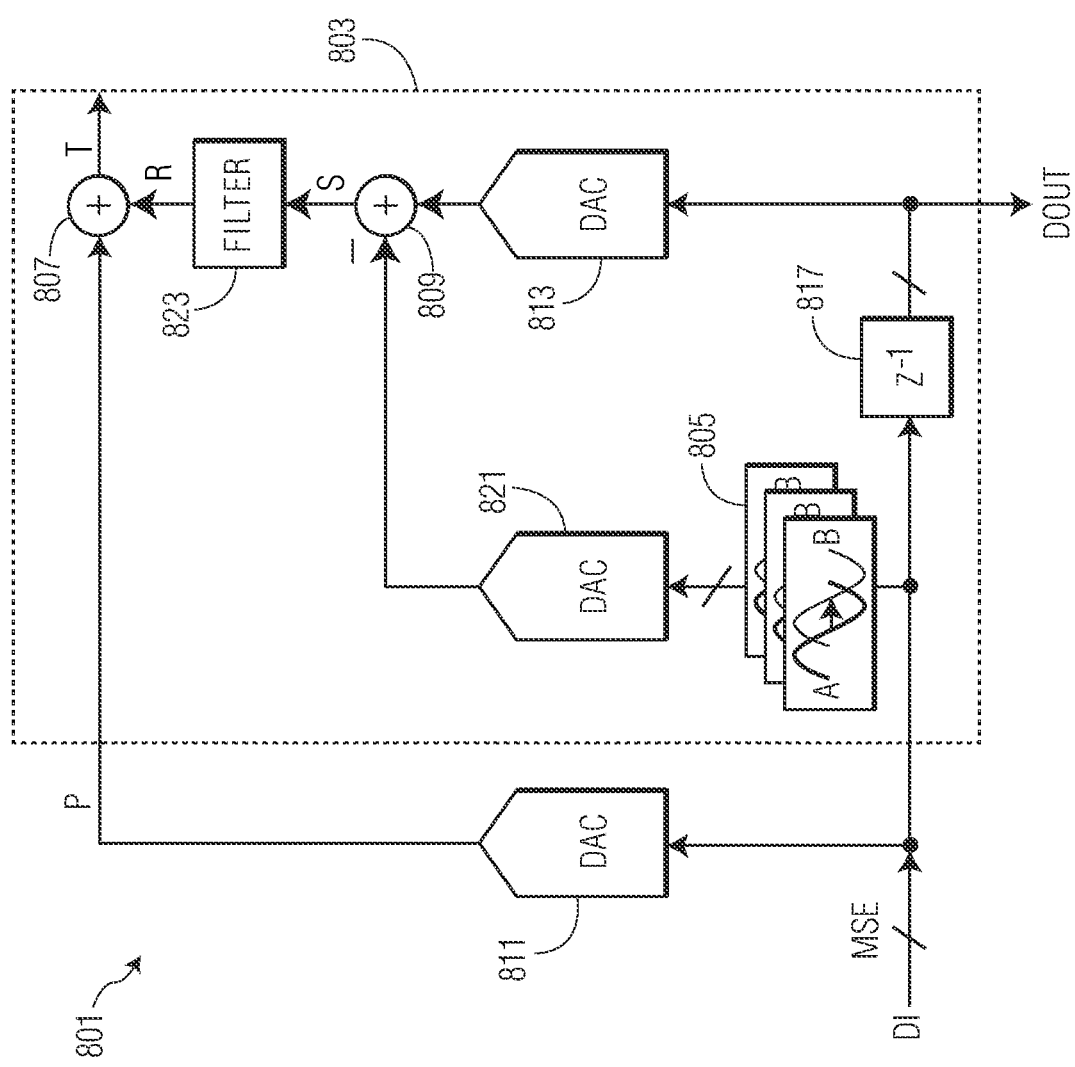
FIG. 8 is a circuit diagram of a circuit including a metastability shaper according to another embodiment of the present invention.

FIG. 8 is a circuit diagram of another embodiment of a portion of an ADC circuit that includes a shaping circuit for providing an adjusted analog signal T to compensate for a metastable error in a digital input signal. Circuit 801 includes a DAC 811 which is similar to DAC 411 of FIG. 4 and a shaper circuit 803. Circuit 801 includes a first data path from digital input DI for providing an analog delay signal that includes an analog delay circuit 805 and DAC 821. Analog delay circuit 805 is a multibit analog delay circuit that includes an analog delay element for each bit signal of DI. Circuit 801 includes a second data path from digital input DI for providing a delayed analog signal that includes digital delay circuit 817 and DAC 813. Combiner circuit 809 subtracts the output of DAC 821 from the output of DAC 813.

Circuit 801 includes a filter 823 for filtering the output of combiner circuit 809 (signal S) so as to provide a smoother signal (signal R). Combiner circuit 807 adds the output of filter 823 with the output of DAC 811 to produce an analog signal that is indicative of the voltage values of D1 and is adjusted to compensate for metastable errors.

Figure 9:
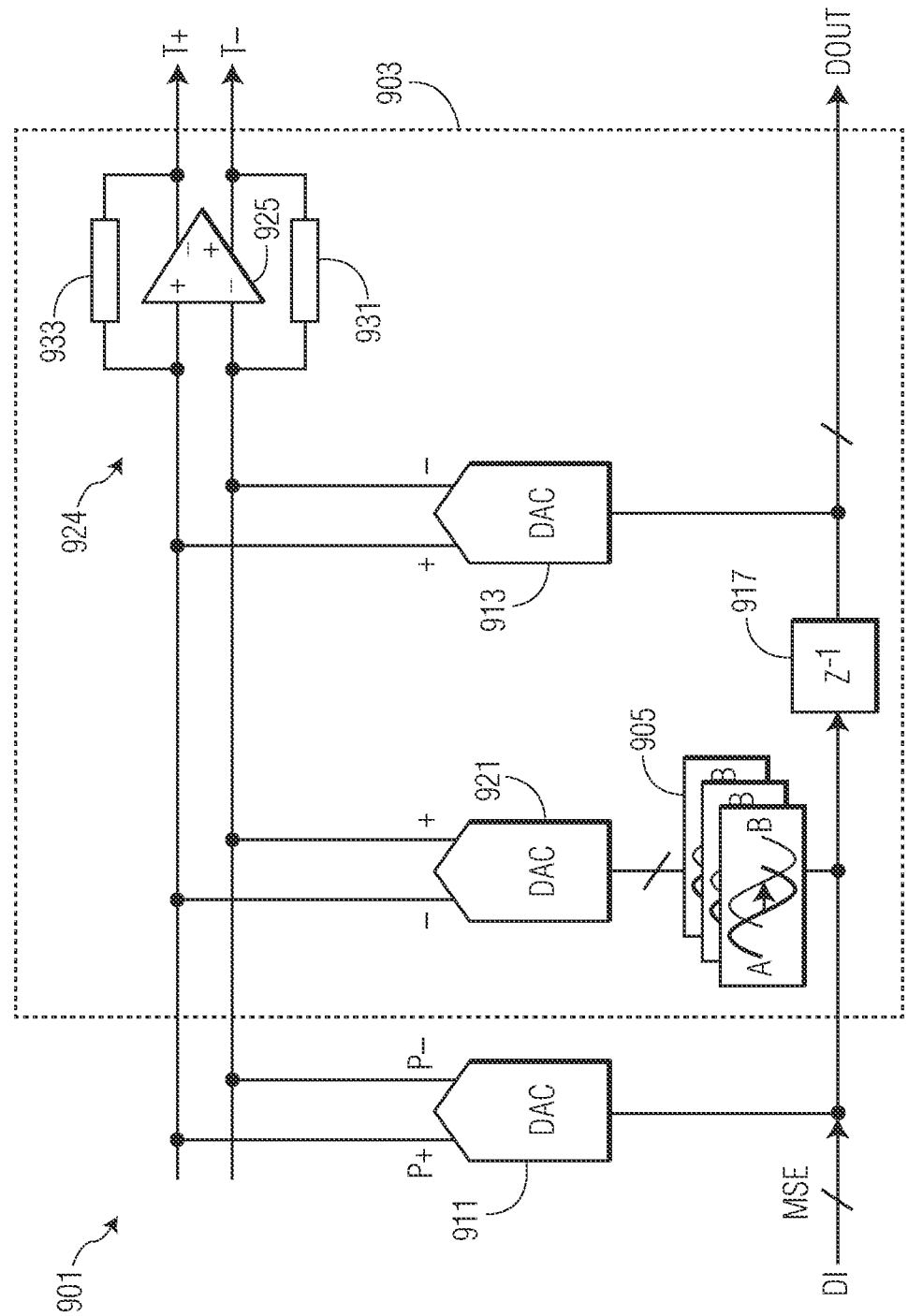
FIG. 9 is a circuit diagram of a circuit including a metastability shaper according to another embodiment of the present invention.

FIG. 9 sets forth another embodiment of a portion of an ADC circuit that includes a shaping circuit for providing an adjusted analog signal T to compensate for a metastable error in a digital input signal. Circuit 901 includes a DAC 911 and a shaper circuit 903. Circuit 901 includes a first data path from digital input DI for providing a delayed analog signal that includes an analog delay circuit 905 and DAC 921. In the embodiment shown, analog delay circuit 905 is a multibit analog delay circuit that includes an analog delay element for each digital bit of the DI signal to individually delay the bit signal. Circuit 901 includes a second data path from digital input DI for providing a delayed analog signal that includes digital delay circuit 917 and DAC 913. In the embodiment shown, DACs 911, 921 and 913 have differential outputs that produce a differential analog signal. In the embodiment shown, signal DI and DOUT are multibit, parallel, single ended signals. In other embodiments, they may be differential digital signals. In one embodiment, DAC 921 has the same configuration as DAC 911.

Circuit 901 includes a combination circuit 924 which includes operational amplifier 925 and impedance circuits 931 and 933. As shown in FIG. 9, operational amplifier 925 is configured to subtract the output voltage of DAC 921 from the summed output voltages of DACs 911 and 913. The non inverting outputs of DACs 911 and 913 and the inverting output of DAC 921 are connected to the non inverting input of op amp 925. The inverting outputs of DACs 911 and 913 and the non inverting output of DAC 921 are connected to the inverting input of op amp 925. In this configuration, the currents are summed in the current domain and converted to the voltage domain by operational amplifier 925 and feedback impedance circuit 933 and 931. The adjusted analog output signal T is a differential signal. Other types of combination circuits may be used in other embodiments.

Figure 10:
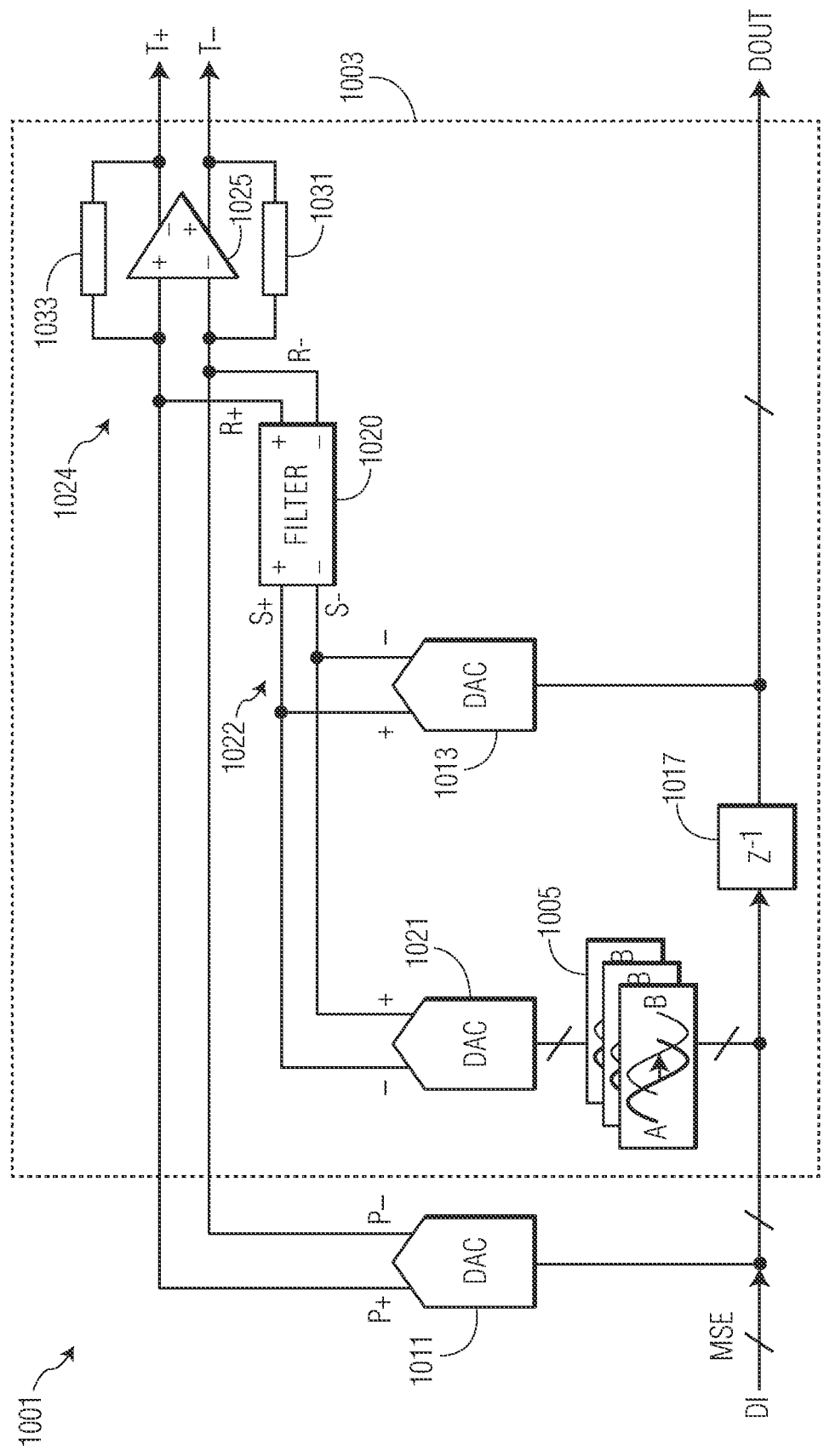
FIG. 10 is a circuit diagram of a circuit including a metastability shaper according to another embodiment of the present invention.

FIG. 10 sets forth another embodiment of a portion of an ADC circuit that includes a shaping circuit for providing an adjusted analog signal T to compensate for a metastable error in a digital input signal. Circuit 1001 includes a DAC 1011 and a shaper circuit 1003. Circuit 1001 includes a first data path from digital input DI for providing a delayed analog signal that includes an analog delay circuit 1005 and DAC 1021. In the embodiment shown, analog delay circuit 1005 is a multibit analog delay circuit that includes an analog delay element for each digital bit of the DI signal to individually delay the bit signal. Circuit 1001 includes a second data path from digital input DI for providing a delayed analog signal that includes digital delay circuit 1017 and DAC 1013. In the embodiment shown, DACs 1011, 1021 and 1013 have differential outputs that produce an analog differential signal. In the embodiment shown, signal DI and DOUT are multibit, parallel, single ended signals. In other embodiments, they may be differential digital signals. In one embodiment, DAC 1021 has the same configuration as DAC 1011.

Circuit 1001 includes a combination circuit 1022 for subtracting the output of DAC 1021 from the output of DAC 1013. In the embodiment shown, combination circuit 1022 is implemented by connecting the inverted output of DAC 1021 with the non inverted output of DAC 1013 and non inverted input of Filter 1020 and by connecting the non inverting input of DAC 1021 with the inverting output of DAC 1013 and the inverting input of filter 1020. Filter 1020 smooths the combination of the outputs of DAC 1021 and DAC 1013. Circuit 1001 includes a combination circuit 1024 which includes operational amplifier 1025 and impedance circuits 1031 and 1033. As shown in FIG. 10, operational amplifier 1025 is configured to add the output voltage of DAC 1011 with the output of filter 1020. The non inverting outputs of DAC 1011 and filter 1020 are connected to the non inverting input of op amp 1025. The inverting outputs of DAC 1011 and filter 1020 are connected to the inverting input of op amp 1025. In this configuration, the currents are summed in the current domain and converted to the voltage domain by operational amplifier 1025 and feedback impedances 1033 and 1031. The adjusted analog output signal T is a differential signal. Other types of combination circuits may be used in other embodiments.

Figure 11:
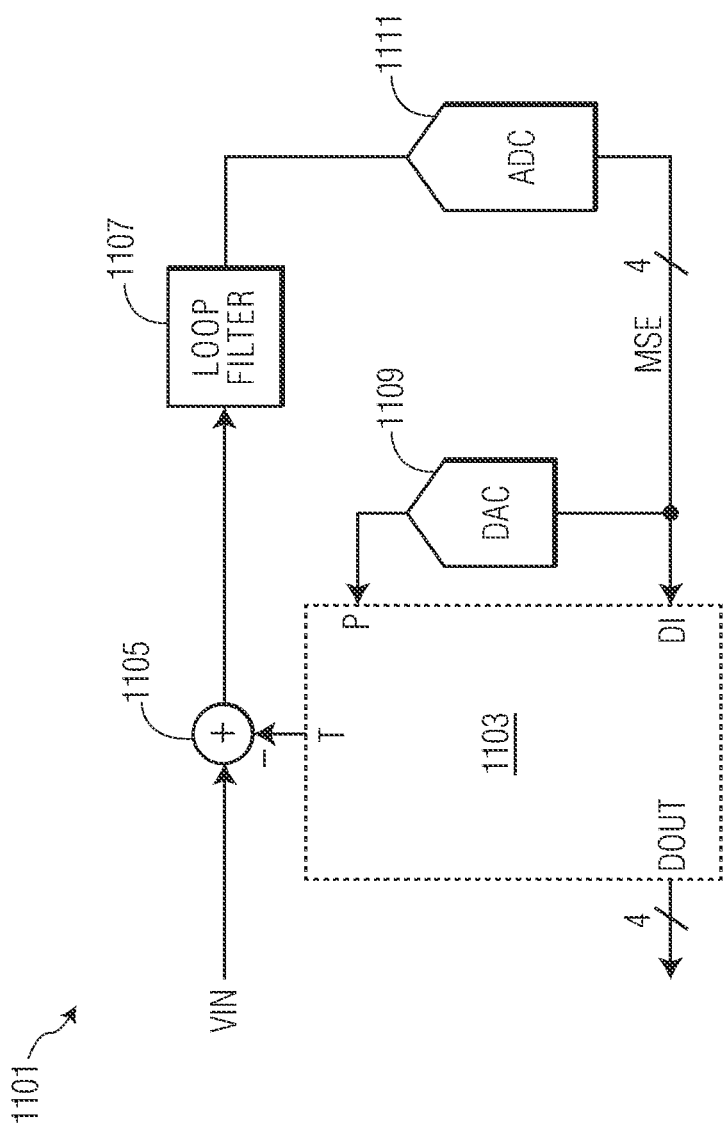
FIG. 11 is a block diagram of a digital to analog convertor circuit with a metastability shaper according to one embodiment of the present invention.

FIG. 11 is a circuit diagram of an ADC circuit 1101 that includes a shaper circuit 1103. In the embodiment shown, Circuit 1101 is 4th order, 4 bit, single loop delta-sigma ADC circuit. Circuit 1101 includes an ADC 1111 that converts a filtered analog signal from loop filter 1107 and provides a 4 bit output. In one embodiment, ADC circuit 1101 may be part of a wider bit ADC circuit. In one embodiment, ADC 1111 is a 4 bit flash ADC that includes regenerative latches (not shown but similar to the latch in FIG. 1) that produce digital outputs (DI) that have a propensity to generate metastable errors. In one embodiment, the regeneration gain of ADC 1111 is 60 dB. The output of shaper circuit 1103 provides the digital output (DOUT) for circuit 1101. In some embodiments, digital signals DI and DOUT may be differential outputs. Other types of ADCs, including ADCs of different bit widths, may be used in other embodiments.

In the embodiment shown, DAC 1109 provides an analog voltage (P) of the voltage indicated by DI. Circuit 1101 includes a shaper circuit 1103 for adjusting the analog signal P to compensate for metastable errors in DI where the metastable errors cause the voltage of signal P not to match the corresponding value of DI. Shaper circuit 1103 may be implemented with any one of shaper circuits 403, 603, 703, 803, 903, 1003. In some embodiments, analog signals T, P, and VIN may be differential signals.

In the embodiment of FIG. 11, the adjusted analog signal T is used to adjust VIN based upon a difference between VIN and the output of DAC 1109 to provide an output digital signal DOUT that more accurately represents VIN. Utilizing a shaper circuit 1103 allows for the shaping of the feedback analog signal T to compensate for differences between the voltage indicated by DOUT and the output of DAC 1109 in a subsequent cycle due to a metastable error.

Providing a metastability shaper that adjusts an analog output (T) corresponding to a subsequent time period to compensate for a metastable error occurring in a previous time period may provide for a data handling circuit that can compensate for metastable errors without delaying the conversion of analog output (T). For example, if circuit 1101 were designed to provide T as an accurate voltage of the voltage indicated by DOUT where the metastable errors are resolved, then the input of DAC 1109 would have to be delayed (e.g., by a clock cycle) to where the metastable errors in the output of ADC 1111 would settle out. However, delaying T by such a clock cycle may significantly decrease the effectiveness of the feedback signal T which may reduce the stability of circuit 1101. On the other hand, adjusting signal T for metastable errors in a later time period allows DOUT to be compensated for metastable errors without reducing circuit stability.

Figure 12:
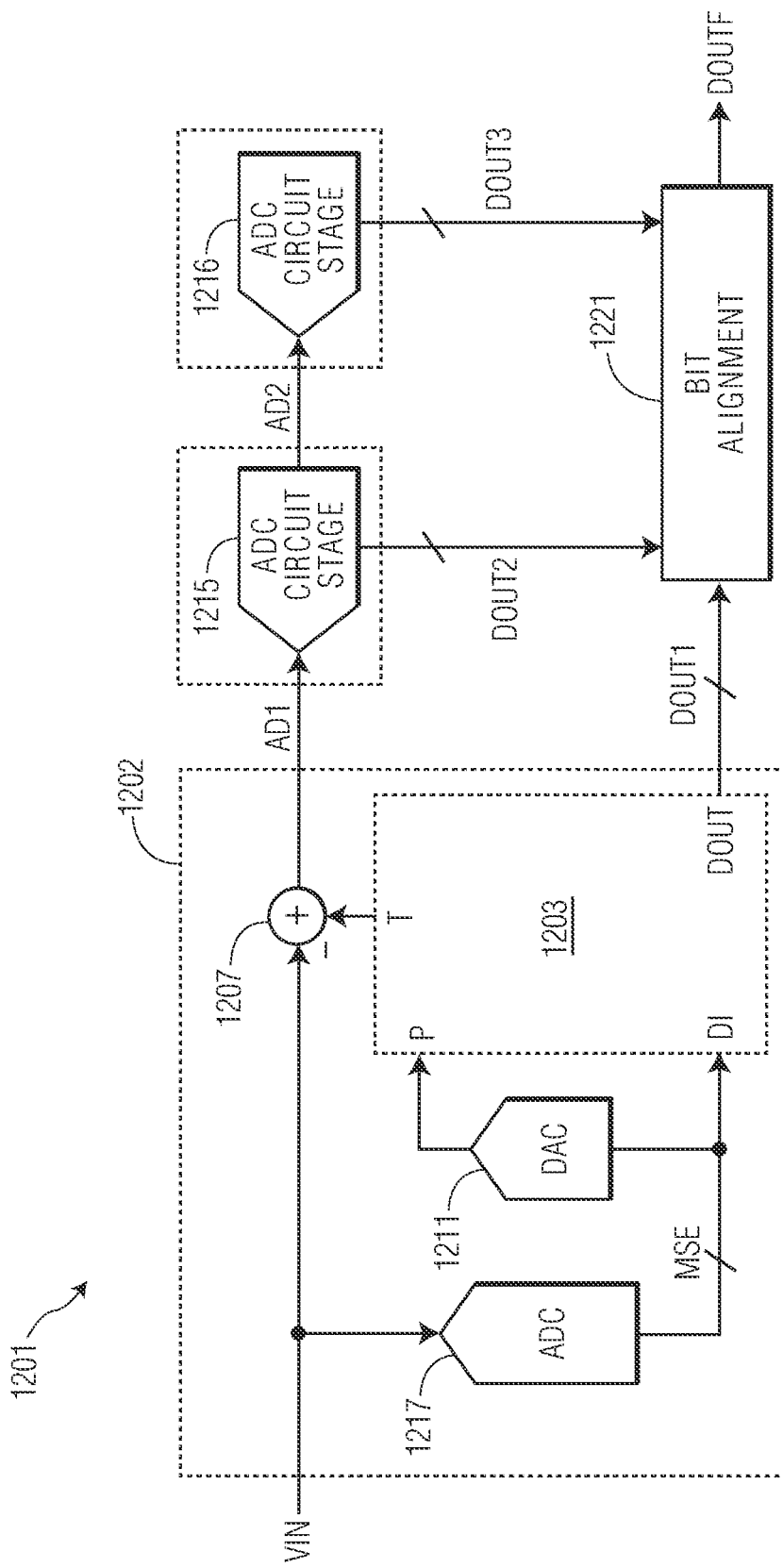
FIG. 12 is a block diagram of a digital to analog convertor circuit with a metastability shaper according to another embodiment of the present invention.

FIG. 12 is a circuit diagram of a pipelined ADC circuit 1201 that converts analog VIN to a digital signal DOUTF. Circuit 1201 includes an ADC circuit stage 1202 with an ADC 1217 that provides a digital output that has a propensity to generate metastable errors. ADC stage 1202 includes DAC 1211, is similar to DAC 411, and shaper circuit 1203. Shaper circuit 1203 may be similar to any one of shaper circuits 403, 603, 703, 803, 903, and 1003. Circuit 1201 also includes ADC circuit stages 1215 and 1217 and bit alignment circuit 1221 for combining the outputs of each stage (DOUT1, DOUT2, and DOUT3) to generate the final digital output signal DOUTF.

In one embodiment, ADC 1217 of stage 1202 provides in signal DOUT1, a coarse A to D conversion of VIN. Signal T is ideally an analog representation of DOUT1 that is subtracted from VIN to produce analog signal AD1, which is provided to the next stage 1215 for finer A to D conversion. In one embodiment, stage 1215 does a finer conversion of AD1 to produce DOUT2, and subtracts an analog representation of DOUT2 from AD1 to produce analog difference signal AD2. Signal AD2 is provided to the next stage 1216 for an even finer conversion in producing DOUT2. In one embodiment, bit alignment circuit 1221 weights the digital outputs from each stage (DOUT1, DOUT2, and DOUT3) in generating the final digital output DOUTF. Circuit 1201 may include a different number of stages in other embodiments.

Because stages 1215 and 1216 process signal AD1 or an analog signal (AD2) that depends on AD1, differences between DOUT1 and signal T due to metastable errors may reduce the effectiveness of circuit 1201. Accordingly, utilizing a metastability shaper to compensate for metastable errors provides for a more effective ADC circuit, especially for a circuit that unitizes ADCs that have a propensity to generate metastable errors. Stages 1215 and 1216 may also include shaper circuits as well. ADC circuits may have other configurations in other embodiments.

Figure 13:
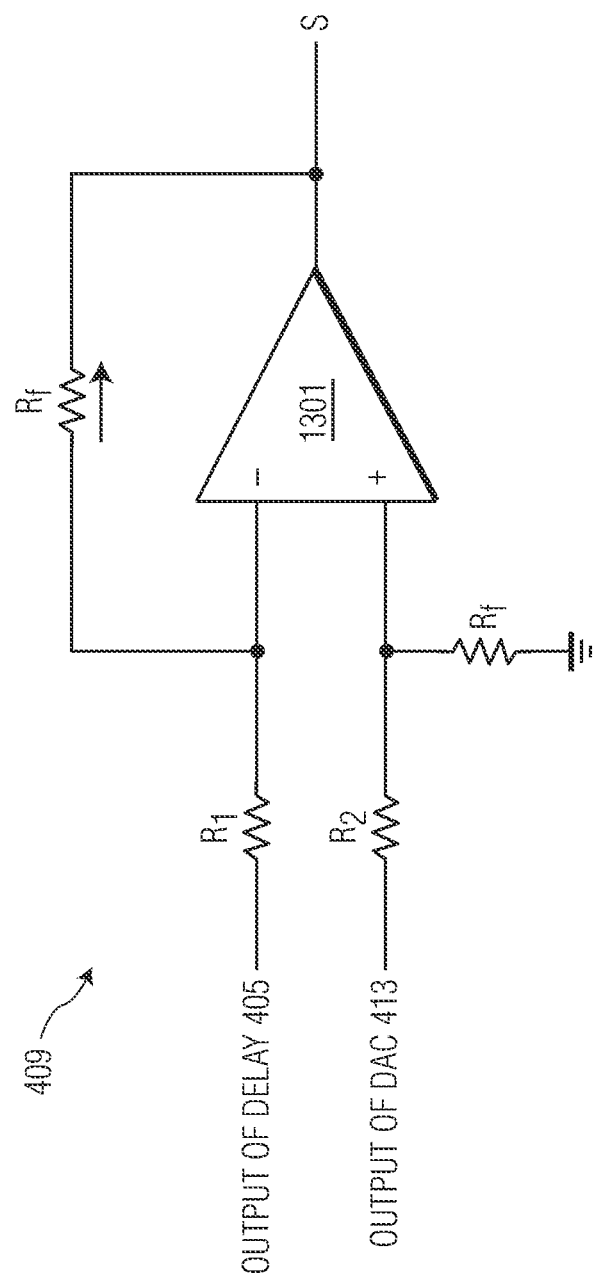
FIG. 13 is a circuit diagram of a subtractor circuit used in a metastability shaper according to one embodiment of the present invention.

FIG. 13 sets forth an example of a combiner circuit 409 that subtracts the output of delay circuit 405 from the output of DAC 413 to produce the signal S. In the embodiment of FIG. 13, circuit 409 includes an operational amplifier 1301 with its inverting input coupled to receive the output of delay circuit 405 through resistor R1 and its non inverting input coupled through resistor R2 to the output of DAC 413. Other types of combiner circuits having other configurations for signal subtraction may be used in other embodiments as well.

Figure 14:
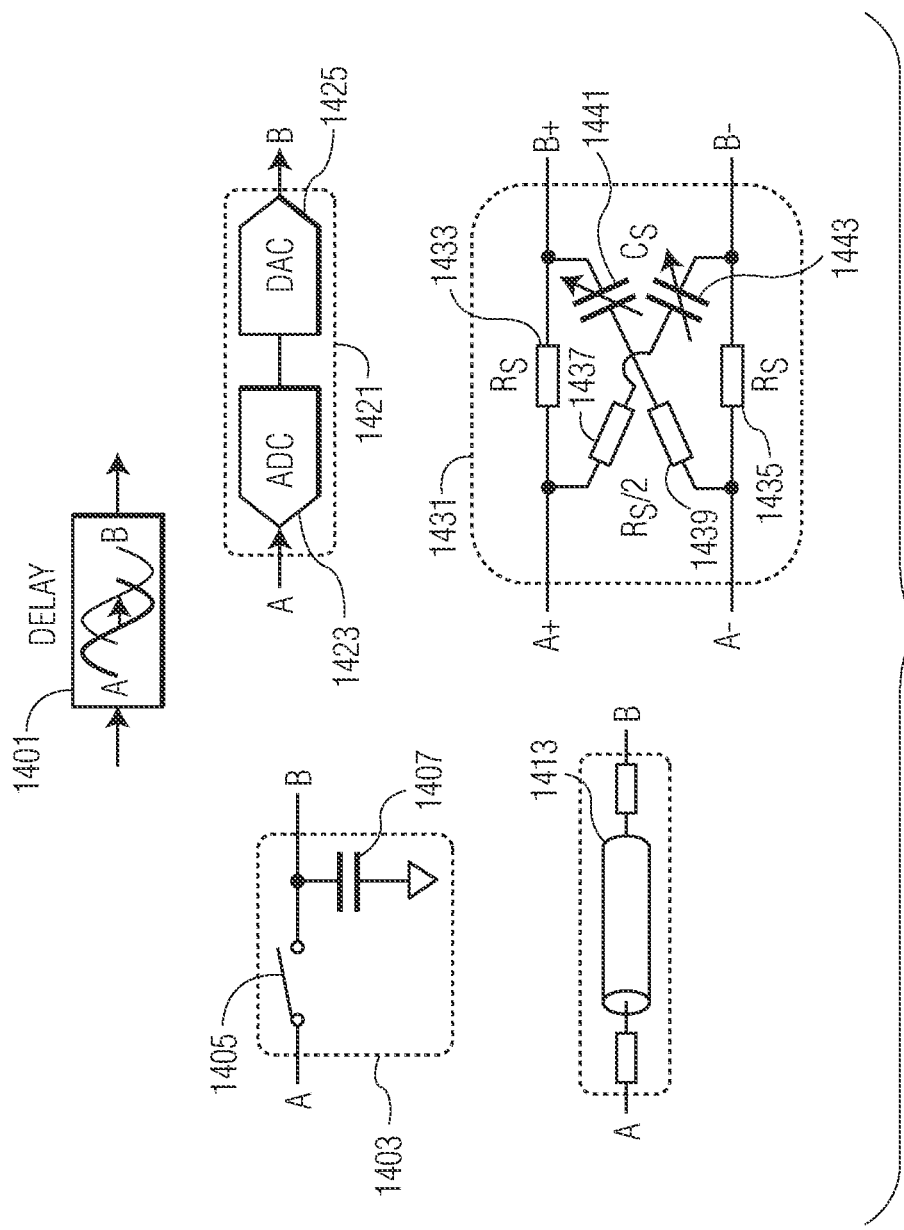
FIG. 14 is a diagram showing implementations of embodiments of an analog delay circuit according to embodiments of the present invention.

FIG. 14 shows embodiments that may be used to implement a single element analog delay circuit 1401 where node A is the input and node B is the output. Delay circuit 1403 is implemented as a sample and hold circuit with a sampling switch 1405 and a holding capacitor 1407. Delay circuit 1411 is implemented as a transmission line 1413. Delay circuit 1421 is implemented with a back to back ADC circuit 1423 and DAC circuit 1425. Delay circuit 1431 is a differential delay circuit implemented as an artificial RC delay with resisters 1433, 1437, 1439, and 1435 and variable capacitors 1441 and 1443. An analog delay circuit may have other configurations in other embodiments.

The circuitry shown or describe herein may include other devices and/or have other configurations. For example, referring to FIG. 4, a circuit may include a driver circuit located between digital delay circuit 417 and DAC 413 to increase the drive strength of the DOUT signal being provided as an output. In one embodiment, metastability shaper circuit 403 of FIG. 4 is a 1st order shaper. However, metastability shaper circuits may be of other orders (e.g., 2nd, 3rd, or 4th) in other embodiments to provide for a different shaping response. Furthermore, the metastability shapers may have other configurations and may be used in other types of circuits such as in different types of ADC converter circuits, communication busses, or memory circuits.

Features described herein with respect to one embodiment may be implemented in other embodiments described herein.

In one embodiment, a circuit includes a digital circuit including a digital output for producing a series of digital signal values and a first data path from the digital output. The first data path includes an analog delay circuit. The first data path for producing a first analog delay signal from the digital output the digital circuit. The circuit includes a second data path from the digital output. The second data path including a digital delay circuit and a digital to analog converter for producing a second analog delay signal from the digital output of the digital circuit. The circuit includes an analog circuit output for producing an analog output signal having values over time corresponding to the digital signal values of the series. The first analog delay signal and the second analog delay signal are used to adjust a later analog output signal value of the analog output signal that is produced by the analog circuit output subsequent to a former analog output signal value of the analog output signal produced by the analog circuit output that corresponds to a digital signal value of the series with a metastable error analog output signal.

In another embodiment, a circuit includes a digital circuit including a digital output for producing a series of digital signal values and a first data path from the digital output.

The first data path includes an analog delay circuit. The first data path for producing a first analog delay signal from the digital output the digital circuit. The circuit includes a second data path from the digital output. The second data path includes a digital delay circuit and a digital to analog converter for producing a second analog delay signal from the digital output of the digital circuit. The circuit includes an analog circuit output for producing an analog output signal having values over time corresponding to the digital signal values of the series. The first analog delay signal and the second analog delay signal are used to adjust an analog output signal value of the analog output signal that is produced by the analog circuit output if the first analog delay signal is different from the second analog delay signal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
a digital circuit including a digital output for producing a series of digital signal values;
a first data path from the digital output, the first data path including an analog delay circuit, the first data path for producing a first analog delay signal from the digital output the digital circuit;
a second data path from the digital output, the second data path including a digital delay circuit and a digital to analog converter for producing a second analog delay signal from the digital output of the digital circuit;
an analog circuit output for producing an analog output signal having values over time corresponding to the digital signal values of the series, wherein the first analog delay signal and the second analog delay signal are used to adjust a later analog output signal value of the analog output signal that is produced by the analog circuit output subsequent to a former analog output signal value of the analog output signal produced by the analog circuit output that corresponds to a digital signal value of the series with a metastable error.

2. The circuit of claim 1 further comprising:
a digital to analog circuit coupled to the digital output of the digital circuit for producing an analog signal from the digital output of the digital circuit;
wherein the analog output signal is produced from the analog signal where the analog signal is modified using the first analog delay signal and the second analog delay signal to adjust the later analog output signal value of the analog output signal that is produced by the analog circuit output.

3. The circuit of claim 1 comprising:
a combiner circuit, the combiner circuit including a first input to receive the first analog delay signal and a second input to receive the second analog delay signal, the combiner circuit performing a combining operation to produce a first analog signal from the first analog delay signal and the second analog delay signal, wherein the first analog signal is used to adjust the later analog output signal value of the analog output signal that is produced by the analog circuit output.

4. The circuit of claim 3 wherein the combining operation includes subtracting the first analog delay signal from the second analog delay signal.

5. The circuit of claim 3 further comprising a filter including an input to receive the first analog signal and an output to provide a filtered first signal, wherein the filtered first signal is used to adjust the later analog output signal value that is produced by the analog circuit output.

6. The circuit of claim 5 further comprising a second combiner circuit including a first input to receive the filtered first signal and a second input coupled to an output of a digital to analog circuit whose input is coupled to the digital output of the digital circuit for producing an analog signal from the digital output of the digital circuit, the second combiner circuit performing a combining operation to produce the analog output signal from the filtered first signal and the analog signal from the output of the digital to analog circuit whose input is coupled to the output of the digital circuit.

7. The circuit of claim 1 wherein the first analog delay signal is subtracted from the second analog delay signal in adjusting the later analog output signal value of the analog output signal.

8. The circuit of claim 1 further comprising a combiner circuit, the combiner circuit including a first input to receive the first analog delay signal, a second input to receive the second analog delay signal, a third input coupled to an output of a digital to analog circuit whose input is coupled to the output of the digital circuit for producing an analog signal from the digital output of the digital circuit, the combiner circuit performing a combining operation to produce the analog output signal from the first analog delay signal, the second analog delay signal, and the analog signal from the output of the digital to analog circuit whose input is coupled to the output of the digital circuit.

9. The circuit of claim 8 wherein the third input is coupled to an output of a digital to analog circuit of the first data path.

10. The circuit of claim 8 wherein the combining operation includes subtracting the first analog delay signal from the second analog delay signal and the analog signal from the output of the digital to analog circuit whose input is coupled to the output of the digital circuit.

11. The circuit of claim 1 wherein the digital circuit is an analog to digital converter.

12. The circuit of claim 11 wherein the analog to digital converter includes an input to receive an analog signal, wherein the analog output signal is used to adjust the analog signal.

13. The circuit of claim 12 further comprising:
a filter circuit to filter the analog signal that has been adjusted;
wherein output of the filter circuit is coupled to an input of the digital to analog converter.

14. The circuit of claim 1 wherein the first data path includes a second digital to analog converter located in the first data path before the analog delay circuit.

15. The circuit of claim 1 wherein the first data path includes a second digital to analog converter located in the first data path after the analog delay circuit, the second digital to analog converter for producing the first analog delay signal.

16. The circuit of claim 15 wherein the analog delay circuit is a multibit analog delay circuit.

17. The circuit of claim 1 wherein the first analog delay signal and the second analog delay signal are each characterized as differential signals.

18. The circuit of claim 1 further comprising:
a multistage pipelined analog to digital converter circuit, wherein the digital circuit, the first data path, the second data path, and the analog circuit output are part of a stage of the multistage pipelined analog to digital converter circuit.

19. The circuit of claim 1 wherein the second data path is configured to convert a digital signal value with a metastable error to a digital signal value without a metastable error.

20. A circuit comprising:
- a digital circuit including a digital output for producing a series of digital signal values;
- a first data path from the digital output, the first data path including an analog delay circuit, the first data path for producing a first analog delay signal from the digital output the digital circuit;
- a second data path from the digital output, the second data path including a digital delay circuit and a digital to analog converter for producing a second analog delay signal from the digital output of the digital circuit;
- an analog circuit output for producing an analog output signal having values over time corresponding to the digital signal values of the series, wherein the first analog delay signal and the second analog delay signal are used to adjust an analog output signal value of the analog output signal that is produced by the analog circuit output if the first analog delay signal is different from the second analog delay signal.

* * * * *